(12) United States Patent
Kobayashi et al.

(10) Patent No.: US 6,617,021 B2
(45) Date of Patent: Sep. 9, 2003

(54) ADHESIVE COMPOSITION AND ADHESIVE SHEET FOR SEMICONDUCTOR DEVICES

(75) Inventors: Masaharu Kobayashi, Shizuoka (JP); Osamu Oka, Shizuoka (JP); Yasuhiro Yoshii, Shizuoka (JP)

(73) Assignee: Tomoegawa Paper Co., Inc., Tokyo (JP)

( * ) Notice: Subject to any disclaimer, the term of this patent is extended or adjusted under 35 U.S.C. 154(b) by 0 days.

(21) Appl. No.: 10/068,945

(22) Filed: Feb. 11, 2002

(65) Prior Publication Data

US 2002/0155286 A1 Oct. 24, 2002

(30) Foreign Application Priority Data

Feb. 14, 2001 (JP) ..................................... P2001-037657

(51) Int. Cl.$^7$ ............................................... B32B 27/38
(52) U.S. Cl. .................... 428/355; 428/413; 428/447; 428/41.8; 428/901; 525/101; 525/106; 525/476; 525/479; 528/27; 528/33; 528/38

(58) Field of Search ................................. 525/474, 476, 525/479, 101, 106, 187, 534, 540, 942; 528/27, 33, 38; 428/447, 413, 901, 41.8, 355 EP (56) References Cited

U.S. PATENT DOCUMENTS 5,536,970 A * 7/1996 Higashi et al. ............. 257/676
6,541,541 B2 * 4/2003 Masamune et al. ......... 523/217

* cited by examiner

Primary Examiner—Robert Dawson
Assistant Examiner—Christopher M. Keehan
(74) Attorney, Agent, or Firm—Nixon & Vanderhye P.C.

(57) ABSTRACT

An adhesive composition for semiconductor devices contains as essential components (A) epoxy resin, (B) phonolic resin, (C) epoxidized styrene-butadiene-styrene block copolymer and (D) diaminosiloxane compound. The adhesive composition is excellent in heat resistance, thermal cycle test and humidity resistance. An adhesive sheet employing the above adhesive composition is also provided.

9 Claims, 1 Drawing Sheet

ADHESIVE COMPOSITION AND ADHESIVE SHEET FOR SEMICONDUCTOR DEVICES

BACKGROUND OF THE INVENTION

1. Field of the Invention

The present invention relates to an adhesive composition and to an adhesive sheet suitable for use in semiconductor devices using various semiconductors, particularly a semiconductor device having a structure in which an IC chip is laminated on an IC board consisting of an IC insulator layer and a conductor circuit, a surface-mounting type semiconductor device and a multi IC chip type semiconductor device, and more particularly relates to an adhesive composition and an adhesive sheet for bonding an IC chip or a radiator plate, or laminating with an increased density on an IC board, i.e., for bonding an IC chip to an IC board, insulating layers together for a higher-density lamination on an IC board, an IC chip and a radiator plate, a radiator plate and an IC board, and/or IC chips together.

2. Description of the Related Art

With the recent spread of portable personal computers and cellular phones, there has been an increase in demand for electronic equipment which is reduced in size, is thicker, and is multifunctional.

In order to meet these demands, electronic parts must be reduced in size with an increased scale of integration, and furthermore, a high-density mounting technique of electronic parts is necessary.

As for IC packages constituting the core of electronic parts in recent years, periphery-mounting types such as a QFP (Quad Flat Package) and an SOP (Small Outline Package) have been typically used. Recently, however, IC packages of a surface-mounting type called BGA (Ball Grid Array), CSP (Chip Size Package) and BOC (Board On Chip) and packages of a multi IC chip type called MCP (Multi Chip Package) have been highlighted as IC packages capable of high-density mounting.

In the BGA, CSP and BOC, solder balls are provided in the form of a surface lattice on their back surface as connecting terminals to the outside. An electrode of the IC (semiconductor integrated circuit) is connected to an electrode of a printed circuit board through an IC board or wiring-pattern-of-a-circuit switching board. There have been developed, depending on the type of the IC board, a plastic BGA (hereinafter referred to as "P-BGA"), a ceramic BGA (hereinafter referred to as "C-BGA"), a tape BGA (hereinafter referred to as "T-BGA"), an enhanced BGA (hereinafter referred to as "E-BGA") and the like.

Until recently, the P-BGA, which is capable of making use of a wire bonding technique in the QFP, has been widely used. However, the T-BGA which utilizes a TAB (Tape Automated Bonding) technique is becoming increasingly common because it enables further densification (pin multiplication) and is excellent in heat radiation.

The CSP is a package made by further size reduction and densifying the BGA and is called a "micro-BGA" or "fine pitch BGA". Owing to its structure, the CSP has excellent electrical reliability such as low impedance and a rapid frequency response.

Figure 1:
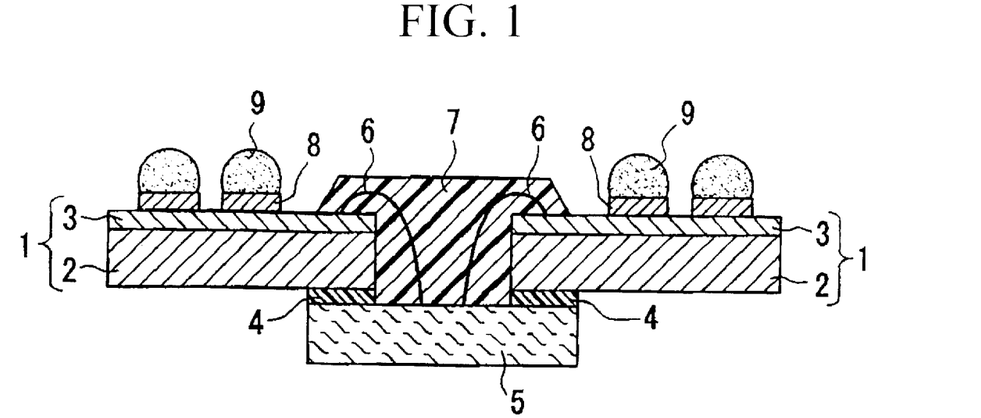
FIG. 1 is a cross-sectional view of an example of an IC package (fine pitch BGA) to which the present invention is applied.

One example of a fine pitch BGA is shown in cross section in FIG. 1.

An IC board 1 in this example consists of an insulator layer 2 and a conductor circuit of a conductor electrode 3 and the like formed on one surface of the insulator layer 2, with a central hole provided therein. The IC board 1 is laminated through an adhesive layer 4 on an IC chip 5. The IC chip 5 is connected through a bump formed thereon to the conductor electrode 3 with a metal wire 6. The wiring and connections are covered with resin 7. Wiring 8 is formed on those portions of the conductor electrode 3 that are not covered with resin 7, with a solder ball 9 formed on the wiring so as to electrically connect the BGA to the outside.

Figure 2:
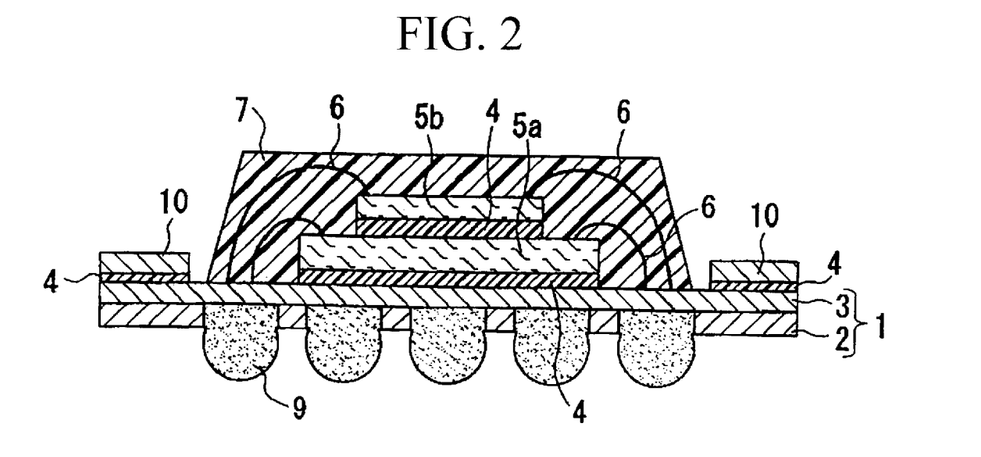
FIG. 2 is a cross-sectional view of another example of an IC package (fine pitch BGA) to which the present invention is applied.

Another example of a fine pitch BGA is shown in cross section in FIG. 2. An IC board 1 in this example consists of an insulator layer 2 and a conductor electrode 3 formed on one surface of the insulator layer. The insulator layer 2 is provided with a plurality of throughholes for solder connection, from the side where the conductor electrode 3 is not formed, to the conductor electrode. A first IC chip 5a and a reinforcing plate 10 are laminated through an adhesive layer 4 onto the conductor electrode 3 formed on the insulator layer 2, and a second IC chip 5b is laminated through an adhesive layer 4 on the first IC chip 5a. The IC chips 5a and 5b are connected through bumps formed thereon to the conductor electrode 3 with metal wires 6. The wiring and connections are covered with resin 7. A solder ball 9 is formed in the throughholes provided in the insulator layer 2 so as to come into contact with the conductor electrode 3 and electrically connect the BGA to the outside.

Figure 3:
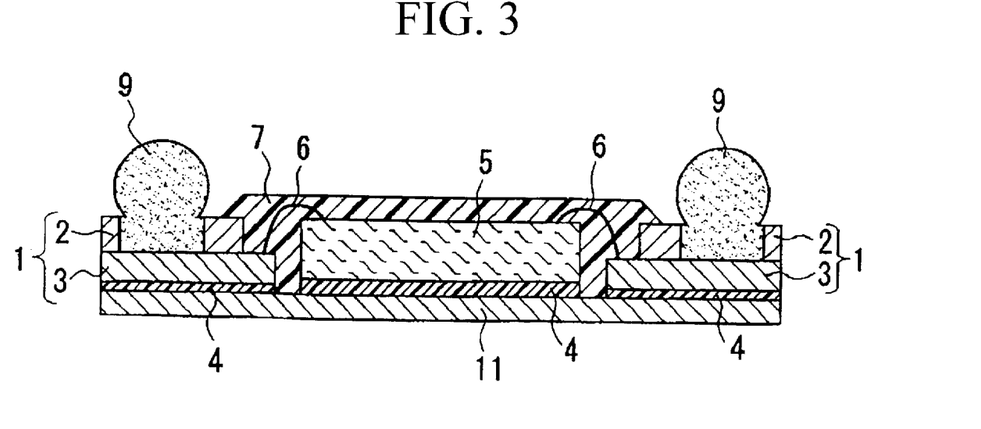
FIG. 3 is a cross-sectional view of yet another example of an IC package (fine pitch BGA) to which the present invention is applied.

Another example of a fine pitch BGA is shown in cross section in FIG. 3. In the fine pitch BGA of this example, a conductor electrode 3 and an IC chip 5 are laminated through an adhesive layer 4 on one surface of a radiator plate 11. On that surface of the conductor electrode 3 which has no adhesive layer 4 thereon, an insulator layer 2 is provided which has throughholes for solder connection to the conductor electrode 3, so as to constitute an IC board 1. The IC chip 5 is connected through a bump formed thereon to the conductor electrode 3 with a metal wire 6. The wiring and connections are covered with resin 7. A solder ball 9 is formed in the throughholes provided in the insulator layer 2 so as to come into contact with the conductor electrode 3 and electrically connect the BGA to the outside.

For forming the insulator layer 2, which constitutes the IC board, a board material employing polyimide resin, epoxy resin, phenolic resin or the like is usually used. Furthermore, for forming the adhesive layer 4, an epoxy resin/NBR (acrylonitrile-butadiene copolymer) based adhesive, an epoxy resin/phenolic resin based adhesive and a rubber-modified epoxy resin/phenolic resin based adhesive have conventionally been used.

An IC package, when driven, reaches temperatures of 100° C. or more due to heat generated by the IC and is exposed to changes in temperature from room temperature to an elevated temperature (100° C. or more). Accordingly, the IC package is required to have heat resistance to withstand the stress changes in that case, humidity resistance under high temperature conditions, and a stress relaxing property.

Especially in recent years, the mounting density has been increased, with the result that the proportion of wired conductive metal is made larger, thereby making it necessary to bond together materials having different coefficients of thermal expansion. An IC package is also required to be capable of withstanding stresses caused in that case. The adhesive as composed above, however, does not have sufficient resistance to long-term temperature changes, nor sufficient resistance to high temperatures and high humidity.

More specifically, due to the stress resulting from repetition of cycling the temperature change between room temperature and an elevated temperature (100° C. or more), delamination often occurs between the above IC-board-constituting insulator layer 2 and the IC chip 5, or inside the laminated board. Furthermore, as a method for enhancing the mounting density, insulator layers may be laminated to form a three-dimensional wiring pattern. This method also has the same drawback. In this laminating-type high density mounting method, as laminating substrates, there has been in many cases employed, in addition to a glass epoxy board, a TAB board, a flexible board or the like for the purpose of thinning the package, most of the materials of which are polyimide resin and the like.

Generally speaking, polyimide resin and the like are very difficult to bond and are susceptible to influences from the conditions of absorbed water, interface and the like. Thus, an adhesive composition of low water absorption and excellent adhesion has been demanded.

Furthermore, in this laminating-type high density mounting method, a wiring pattern must be embedded during lamination. Thus, an adhesive composition has been demanded which is free of resin flow during the embedding and free of foaming during bonding.

Furthermore, with elevation of an IR reflow temperature due to the lead-free tendency in recent years, the water contained in an adhesive is likely to vaporize and push aside the adhesive during the reflow, thereby giving rise to a blister-causing water-vapor explosion called a popcorning. Therefore, in order to remove the popcorning-causing water content, semifinished products prior to the reflow have been managed under moisture excluding conditions. However, since management under moisture excluding conditions requires much labor and cost, an adhesive composition has been demanded which does not give rise to the popcorning if not managed under moisture excluding conditions.

Furthermore, in view of its application to a conductor portion, an adhesive composition is required to have electrical reliability.

SUMMARY OF THE INVENTION

The present invention has been made to overcome the above drawbacks, and one of its objects is to provide an adhesive composition and an adhesive sheet for semiconductor devices, which overcome the drawback in the conventional adhesive compositions used in semiconductor devices such as BGA and CSP or the drawback of delamination caused by temperature cycling; in other words, which are excellent in stress relaxation and heat/thermal cycle test.

Another object of the present invention is to provide an adhesive composition and an adhesive sheet for semiconductor devices in which adhesive resin does not flow and there is no foaming during bonding and curing, which occurred in the conventional adhesive compositions.

A further object of the present invention is to provide an adhesive composition and an adhesive sheet for semiconductor devices that are excellent in electrical reliability and strength of adhesion to copper, polyimide and the like.

Yet another object of the present invention is to provide an adhesive composition and an adhesive sheet for semiconductor devices which overcome the drawback in the conventional adhesive compositions or the popcorning caused by vaporization of the water contained in the adhesive composition during the reflowing; in other words, which have excellent resistance to humidity.

In order to attain the objects, according to one aspect of the present invention, there is provided an adhesive composition for semiconductor devices, which comprises (A) epoxy resin, (B) phenolic resin, (C) epoxidized styrene-butadiene-styrene block copolymer, and (D) diaminosiloxane compound.

Preferably, a ratio of the (A) epoxy resin to the (B) phenolic resin is 1:0.6 to 1:1.4 in terms of an equivalent ratio of functional groups.

Preferably, a ratio of the (C) epoxidized styrene-butadiene-styrene block copolymer is 30 to 80% by weight of a total solid content of the adhesive composition.

Preferably, a weight ratio of butadiene to styrene in the (C) epoxidized styrene-butadiene-styrene block copolymer is 1/99 to 70/30.

Preferably, an epoxy equivalent of the (C) epoxidized styrene-butadiene-styrene block copolymer is 140 to 6000.

Preferably, the (D) diaminosiloxane compound is a diaminosiloxane compound having an amino group at both ends represented by a general formula (1):

wherein R' is an alkylene group having 1 to 10 carbon atoms and n is an integer of 0 to 10.

Preferably, the (D) diaminosiloxane compound is 0.3 to 10% by weight of a total solid content of the adhesive composition.

According to another aspect of the present invention, there is provided an adhesive sheet for semiconductor devices, which comprises a support and an adhesive composition as mentioned above, laminated on at least one surface of the support.

Preferably, the support comprises an insulating film or releasable film.

DETAILED DESCRIPTION OF PREFERRED EMBODIMENTS

Embodiments of the present invention will now be described in detail. An adhesive composition for semiconductor devices according to the present invention is comprised of (A) epoxy resin, (B) phenolic resin, (C) epoxidized styrene-butadiene-styrene block copolymer and (D) diaminosiloxane compound.

Each component of the adhesive composition for semiconductor devices according to the present invention will now be described.

(A) Epoxy Resin

As the epoxy resin, resins of any structure having two or more oxirane rings in a molecule such as, for example, glycidyl ether, glycidyl ester, glycidyl amine, linear aliphatic epoxite and alicyclic epoxite may be used alone or in combination.

Examples include bifunctional epoxy resins such as bisphenol A-type epoxy resin, bisphenol F-type epoxy resin, bisphenol S-type epoxy resin and naphthalene-type epoxy resin, multifunctional glycidyl amine type epoxy resins such as triglycidyl isocyanurate type epoxy resin, triglycidyl-p-aminophenol type epoxy resin, tetraglycidyl diaminodiphenyl methane type epoxy resin, tetraglycidyl m-xylylenediamine type epoxy resin and tetraglycidyl-1,3-bisaminomethylcyclohexane type epoxy resin, multifunctional glycidyl ether type epoxy resins such as tetraphenyl glycidyl ether ethane type epoxy resin and triphenyl glycidyl ether methane type epoxy resin, multifunctional resol type epoxy resins such as phenol type epoxy resin and alkylphenol type epoxy resin, and multifunctional novolak type epoxy resins such as phenol type epoxy resin and cresol type epoxy resin.

Of these, for its low price, bisphenol type epoxy resin, and for its insulating performance and heat resistance, multifunctional epoxy resins, are especially preferably used.

The epoxy resin used in the present invention is preferred to have an epoxy equivalent of 100 to 4000, more preferably 100 to 2000 and particularly preferably 100 to 1000. With an epoxy equivalent less than 100, the resin is likely to remain partially uncured, thereby causing foaming. If the epoxy equivalent exceeds 4000, the resin becomes nearly insoluble in a solvent, resulting in incompatibility with other resins.

More specifically, as the epoxy resins preferably used in the present invention, there can be mentioned, as those supplied by Yuka Shell Epoxy K.K., bisphenol type resins such as those with trade names: Epikote 806, 828, 834 and 1001, bifunctional epoxy resins such as YX-4000 and YX-4000H (biphenyl type), Epikote 152, 154, 180S65, 1032H60 and 157S70 (multifunctional novolak type resins), and 604 (tetraglycidyl diphenyl methane type), as those supplied by Dainippon Ink & Chemicals, Inc., multifunctional epoxy resins such as those with trade names: HP-7200 and HP-7200H (dicyclo type), as those supplied by Nippon Kayaku Co., Ltd., multifunctional epoxy resins such as those with trade names: EOCNI02S, 103S, 104S, 1020 (o-cresol novolak type), EPPN501H and 502H (triphenylmethane type).

Epoxy halide, especially epoxy bromide is advantageously used to impart fire retardance. Examples of epoxy bromide include those with trade names: Epikote 5045, 5046 and 5050 supplied by Yuka Shell Epoxy K.K. and trade names: Bren-S, Bren-105 and Bren-301 supplied by Nippon Kayaku Co., Ltd.

(B) Phenolic Resin

Phenolic resin reacts with epoxy resin to form a three-dimensional network structure.

Examples of the phenolic resins used in the present invention include phenolics such as resol phenol resin, phenol novolak resin, cresol novolak resin, resorcinol resin and xylene resin, of which phenol novolak resin is preferred for its excellent reactivity and excellent resistance to moisture and heat.

The ratio of epoxy resin to phenolic resin in terms of the functional group equivalent ratio is from 1:0.6 to 1:1.4, preferably from 1:0.7 to 1:1.1.

In the above ratio of epoxy resin to phenolic resin, if the ratio of phenolic resin is less than 1:0.6, the cured resin is fragile, while on the other hand, if the ratio of phenolic resin is greater than 1:1.4, the adhesion disadvantageously decreases.

(C) Epoxidized Styrene-Butadiene-Styrene Block Copolymer

Epoxidized styrene-butadiene-styrene block copolymer is a double bond that is derived from a conjugated diene compound in a styrene-butadiene-styrene block copolymer and is epoxidized. In the above, the styrene-butadiene-styrene block copolymer is a block copolymer of a styrene compound and a butadiene compound, and the double bond derived from the conjugated diene compound in the styrene-butadiene-styrene block copolymer may be partially hydrogenated.

The above styrene-butadiene-styrene block copolymer is intended to mean a block copolymer consisting of a styrene compound polymer block A and a butadiene compound polymer block B, of which the styrene compound polymer block A is a styrene-compound-based polymer block and the butadiene compound polymer block B is a butadiene-compound-based polymer block. The copolymerization weight ratio of the styrene compound to the butadiene compound is 1/99 to 70/30, particularly preferably 10/90 to 60/40.

The number average molecular weight of the styrene-butadiene-styrene block copolymer is in the range of 5,000 to 600,000, preferably 10,000 to 500,000, and the molecular weight distribution (ratio of the weight average molecular weight (Mw) to the number average molecular weight (Mn)) is 10 or less.

The molecular structure of the styrene-butadiene-styrene block copolymer may be in the form of a straight chain, branched, radiating or an optional combination of these. For example, at least one styrene compound-butadiene compound block copolymer of a structure selected from A-B, A-B-A, B-A-B-A, A-B-A-B-A and the like may be used.

As the styrene compound constituting the styrene-butadiene-styrene block copolymer, at least one may be selected from, for example, styrene, $\alpha$-methyl styrene, p-tert-butyl styrene, p-methyl styrene, 1,1-diphenyl styrene and the like, of which styrene is preferred.

As the butadiene compound constituting the styrene-butadiene-styrene block copolymer, at least one may be selected from, for example, butadiene, 2,3-dimethyl-1,3-butadiene, phenyl-1,3-butadiene and the like, of which butadiene is preferred.

Any method is employable as the method for producing the styrene-butadiene-styrene block copolymer to be used as material in the present invention, if the produced block copolymer has the structure as mentioned above.

The epoxidized styrene-butadiene-styrene block copolymer used in the present invention may be obtained by reacting the above-mentioned styrene-butadiene-styrene block copolymer or its partially hydrogenated one with an epoxidizing agent such as hydroperoxides, hyperacids and the like in an inert solvent. The hydroperoxides used for the epoxidation include hydrogen peroxide, t-butyl hydroperoxide, cumene peroxide and the like. The hyperacids include performic acid, peracetic acid, perbenzoic acid, trifluoro peracetic acid and the like. Of these, peracetic acid is a preferred epoxidizing agent because of its low price and high stability. In epoxidation, a catalyst may be added as required. For example, in the case of a hyperacid, an alkali such as sodium carbonate or an acid such as sulfuric acid may be used. In the case of a hydroperoxide, a catalytic effect may be obtained by using a mixture of tungstic acid and caustic soda in combination with hydrogen peroxide, an organic acid in combination with hydrogen peroxide, or molybdenum hexacarbonyl in combination with t-butyl peroxide. The inert solvent may be used for the purpose, for example, of lowering the viscosity of materials and stabilization by diluting the epoxidizing agent, and in the case of a peracetic acid, an aromatic compound, ethers, esters and the like may be used. An especially preferred solvent is hexane, cyclohexane, toluene, benzene, ethyl acetate, carbon tetrachloride or chloroform.

There is no specific restriction to the amount of the epoxidizing agent, and the most appropriate amount in each case is determined by variable factors such as the specific epoxidizing agent to be used, the desired degree of epoxidation, the block copolymer to be used and so forth. There is no specific restriction to the epoxidation reaction conditions. The reaction temperature region employable is determined by the reactivity of the epoxidizing agent to be used. For example, in the case of peracetic acid, it is preferred to be 0 to 70° C., because if it is lower than 0° C., a slow reaction results, and if it exceeds 70° C., decomposition of the peracetic acid occurs. No extra processing of the reaction mixture is needed, and it suffices, for example, to agitate the mixture for 2 to 10 hours. The isolation of the obtained epoxidized styrene-butadiene-styrene block copolymer may be effected by a suitable method such as precipitation in a poor solvent, throwing the reaction mixture into hot water while agitating and distilling off the solvent, or direct desolvation.

The epoxy equivalent of the (C) epoxidized styrene-butadiene-styrene block copolymer thus obtained is preferably 140 to 6000, more preferably 200 to 2000. With an epoxy equivalent less than 140, there is obtained less development of polymeric elastic properties such as an increase in extensibility and elasticity, and with an epoxy equivalent exceeding 6000, there is obtained less development of epoxidation-resulting specific properties such as an increased compatibility.

A preferred ratio of the epoxidized styrene-butadiene-styrene block copolymer in an adhesive composition is 30 to 80% by weight of the total solid content. If it is less than 30% by weight, the resin is likely to be too hard and have a reduced adhesion, and if it exceeds 80% by weight, resin flow and foaming disadvantageously takes place during application and curing. Furthermore, if it exceeds 80% by weight, blistering is likely to be caused in the resin, resulting in foaming at an elevated temperature.

(D) Diaminosiloxane Compound

The diaminosiloxane compound used in the present invention is a diaminosiloxane compound that has an amino group at both ends in the following general formula (1).

wherein R1 is an alkylene group having 1 to 10 carbon atoms and n is an integer of 1 to 10.

The ratio of the diaminosiloxane compound in an adhesive composition is preferably 0.3 to 10% by weight, more preferably 0.3 to 5% by weight of the total solids content. If it is less than 0.3% by weight, a decrease is made in compatibility with other resins and a water absorption, and if it exceeds 10% by weight, a decrease in adhesion under normal conditions becomes conspicuous.

As the diaminosiloxane compound having an amino group at both ends, which is represented by the above general formula (1), there can be mentioned, for example, those with trade names TSL9306 and TSL9886 supplied by Toshiba Silicone Co., Ltd.

A coupling agent is preferably added in an adhesive composition of the present invention to make an improvement in adhesion to an adherend.

As the coupling agent, those that have an amino group terminal or epoxy group terminal as their organic group terminal are especially preferred. The coupling agent is preferably added in an amount of 0.1 to 15 parts by weight based on 100 parts by weight of the total amount of (A) epoxy resin, (B) phenolic resin, (C) epoxidized styrene-butadiene-styrene block copolymer, and (D) diaminosiloxane compound.

Furthermore, in order to accelerate the curing of the epoxy resin, a curing accelerator such as imidazole, a derivative thereof, imidazoline, a derivative thereof or tertiary amine may be employed as required, in an amount of 0.01 to 5 parts by weight based on 100 parts by weight of the total amount of the above compounds (A) to (D).

Furthermore, it is preferred that an adhesive composition for semiconductor devices according to the present invention contains an inorganic or organic filler for the purpose of adjusting the thermal expansion coefficient and thermal conductivity and controlling the processability.

As the inorganic filler used in the present invention, there can be mentioned, for example, anhydrous silica, melt-type silica, alumina, titanium oxide, beryllium oxide, magnesium oxide, calcium carbonate, titanium nitride, silicon nitride, boron nitride, titanium boride, tungsten boride, silicon carbide, titanium carbide, zirconium carbide, molybdenum carbide, mica, zinc oxide, carbon black, aluminum hydroxide, calcium hydroxide, magnesium hydroxide, and those with their surfaces treated with a trimethyl siloxyl group or the like.

As the organic filler, there can be mentioned, for example, polyimide, polyamide-imide, polyether ether ketone, polyether-imide, polyester-imide, nylon and silicone.

The filler is contained preferably in an amount of 2 to 95 parts by weight, more preferably 2 to 50 parts by weight based on 100 parts by weight of the total amount of (A) epoxy resin, (B) phenolic resin, (C) epoxidized styrene-butadiene-styrene block copolymer, and (D) diaminosiloxane compound.

The above-mentioned essential components (A) to (D) and various additives are dissolved in an organic solvent to prepare an adhesive solution. There is no specific restriction to the organic solvent used in the present invention. For example, toluene, xylene, methyl ethyl ketone, tetrahydrofuran or the like may be optionally selected to be used alone or in combination in a suitable amount. The adhesive solution is preferably prepared to contain at least 20% by weight of solid content. With a solid content of less than 20% by weight, a homogeneous adhesive sheet is likely to be produced with difficulty.

An adhesive sheet for semiconductor devices according to the present invention is comprised of a support and the above adhesive composition stacked on at least one surface of the support.

Examples of the supports include a releasable film, insulating film and releasing paper, of which the releasable film and insulating film are preferably used.

As the film material used for the releasable film and insulating film, polyesters such as polyethylene terephthalate, polyolefins such as polyethylene, polyimide, polyamide, polyther sulphone, polyphenylene sulfite, polyether ketone and triacetyl cellulose are preferably used, of which polyesters, polyolefins and polyimide are more preferably used. A releasable film is preferably used which is formed of these materials and release-treated with a mold release agent such as silicone.

An adhesive solution made by dissolving the above adhesive composition in an organic solvent is applied onto one or both surfaces of the film and dried to form an adhesive layer, preferably followed by half-curing the adhesive layer.

The half-cured state is suitably controlled to suppress resin flow and foaming under specific processing and use conditions, for example, shortening the curing time and embedding a conductor pattern. Controlling the half-cured state by ageing or the like is preferred, though not limited to a specific method.

The adhesive layer has a dry thickness of 3 to 200 µm, preferably 5 to 100 µm.

The film with the adhesive layer formed thereon is applied with a protective film for storage as required, which protective film is removed in use.

An adhesive composition for semiconductor devices and an adhesive sheet according to the present invention are suited for use in various electronic parts, but are especially suited for use with semiconductors in which an IC board, which includes an insulator layer and a conductor circuit, has an IC chip stacked on its circuit surface or back surface. Examples include a T-BGA which utilizes a TAB technique and a surface-mounting type CSP. More specifically, the adhesive composition and the adhesive sheet of the present invention are advantageously used in such semiconductor devices as shown in FIGS. 1, 2 and 3, as adhesive for bonding together an IC chip and an insulator layer and/or conductor circuit of an IC board.

EXAMPLES

Description of the present invention will now be made in further detail with reference to the Examples to which the invention should not be construed as being restricted.

An epoxidized styrene-butadiene-styrene block copolymer was first synthesized as below.

Synthesis Example 1

300 g of a styrene-butadiene-styrene block copolymer (trade name: TR2000 supplied by Japan Synthetic Rubber Co., Ltd.; number average molecular weight: 100000; copolymerization ratio of styrene/butadiene (weight): 40/60) was charged into a flask equipped with an agitator and a condenser, along with 1500 g of ethyl acetate to be dissolved. 169 g of an ethyl acetate solution of 30% by weight of peracetic acid was then continuously dropped under agitation at 40° C. for 3 hours to effect the epoxidation reaction. The reaction liquid was returned to room temperature to be taken out of the flask, added to a large amount of methanol to effect separation, filtered, washed with water, and dried to obtain an epoxidized styrene-butadiene-styrene block copolymer having an epoxy equivalent of 520.

Synthesis Example 2

300 g of a styrene-butadiene-styrene block copolymer (trade name: TR2000 supplied by Japan Synthetic Rubber Co., Ltd.; number average molecular weight: 100000; copolymerization ratio of styrene/butadiene (weight): 40/60) was charged into a flask equipped with an agitator and a condenser, along with 1500 g of ethyl acetate to be dissolved. 169 g of an ethyl acetate solution of 15% by weight of peracetic acid was then continuously dropped under agitation at 40° C. for 3 hours to effect the epoxidation reaction. The reaction liquid was returned to room temperature to be taken out of the flask, added to a large amount of methanol to effect separation, filtered, washed with water, and dried to obtain an epoxidized styrene-butadiene-styrene block copolymer having an epoxy equivalent of 1000.

Synthesis Example 3

300 g of a styrene-butadiene-styrene block copolymer (trade name: TR2000 supplied by Japan Synthetic Rubber Co., Ltd.; number average molecular weight: 100000; copolymerization ratio of styrene/butadiene (weight): 40/60) was charged into a flask equipped with an agitator and a condenser, along with 1500 g of ethyl acetate to be dissolved. 169 g of an ethyl acetate solution of 5% by weight of peracetic acid was then continuously dropped under agitation at 40° C. for 3 hours to effect the epoxidation reaction. The reaction liquid was returned to room temperature to be taken out of the flask, added to a large amount of methanol to effect separation, filtered, washed with water, and dried to obtain an epoxidized styrene-butadiene-styrene block copolymer having an epoxy equivalent of 2000.

An adhesive composition was then prepared as below.

Examples 1 to 18 and Comparative Examples 1 to 5

(A) Epoxy resin, (B) phenolic resin, (C) epoxidized styrene-butadiene-styrene block copolymer, (D) diaminosiloxane compound, a silane coupling agent, a curing accelerator, and a filler, each in amounts shown in Table 1, were dissolved in methyl ethyl ketone at room temperature to 60° C. to prepare solutions. The solutions were adjusted to have 35% by weight of solids content to obtain adhesive compositions of the present invention and adhesive compositions of comparative examples. The components as shown in Table 1 are named in Table 2.

As for the filler, compounded ratios are shown to 100 parts by weight of the total amount of (A) epoxy resin, (B) phenolic resin, (C) epoxidized styrene-butadiene-styrene block copolymer, (D) diaminosiloxane compound and the silane coupling agent.

Furthermore, in Comparative Example 3, a styrene-butadiene-styrene block copolymer was used in place of the (C) epoxidized styrene-butadiene-styrene block copolymer.

TABLE 1

| | (A) Epoxy resin | | | | (B) Phenolic resin | | (C) Epoxidized styrene-butadiene-styrene block copolymer | | | Styrene-butadiene-styrene block co-polymer | (D) Di-aminosiloxane compound | | Silane coupling agent | | | Curing accel-erator | Part by weight Filler | Functional group equiv-alent ratio of (A)/(B) | Ratio of (C) (% by weight) | Weight ratio of buta-diene/styrene in (C) |
|---|---|---|---|---|---|---|---|---|---|---|---|---|---|---|---|---|---|---|---|---|
| | A-1 | A-2 | A-3 | A-4 | B-1 | B-2 | C-1 | C-2 | C-3 | | D-1 | D-2 | E-1 | E-2 | E-3 | | | | | |
| Ex. 1 | | | 24.2 | | 14.5 | | 56.5 | | | | 1.7 | | | 2.9 | | 0.2 | | 1/0.8 | 56.5 | 60/40 |
| Ex. 2 | 20.1 | | | | 18.7 | | 56.6 | | | | 1.7 | | | 2.9 | | | | 1/0.8 | 56.6 | 60/40 |
| Ex. 3 | | 26.5 | | | 12.4 | | 56.5 | | | | 1.7 | | | 2.9 | | | | 1/0.8 | 56.5 | 60/40 |
| Ex. 4 | | 33.1 | | | 15.4 | | 47.1 | | | | 1.4 | | | 3 | | | | 1/0.8 | 47.1 | 60/40 |
| Ex. 5 | | | | 29.2 | 13.7 | | 52.2 | | | | 1.6 | | | 3.3 | | | | 1/0.9 | 52.2 | 60/40 |
| Ex. 6 | 20.2 | | | | 18.8 | | | 56.6 | | | 1.4 | | | 3 | | | | 1/0.8 | 56.6 | 60/40 |
| Ex. 7 | 20.8 | | | | 19.3 | | | | 58.4 | | 1.5 | | | | | | | 1/0.8 | 58.4 | 60/40 |
| Ex. 8 | | 32 | | | 14.9 | | | 45.6 | | | | 4.6 | 2.9 | | | | | 1/0.9 | 45.6 | 60/40 |
| Ex. 9 | | | 23.6 | | 14 | | | 54.8 | | | | 4.5 | | 2.9 | | 0.2 | | 1/0.8 | 54.8 | 60/40 |
| Ex. 10 | | 27.3 | | | 12.8 | | 58.3 | | | | 1.6 | | | | | | | 1/0.9 | 58.3 | 60/40 |
| Ex. 11 | | 24 | | | 14.3 | | | | 55.8 | | | 5.7 | | | | 0.2 | | 1/0.8 | 55.8 | 60/40 |
| Ex. 12 | | | | 29.3 | 13.7 | | 52.1 | | | | 1.6 | | | | 3.3 | | | 1/0.9 | 52.1 | 60/40 |
| Ex. 13 | 28.7 | | | | 26.7 | | 40 | | | | | 4.6 | | | | | | 1/0.8 | 40 | 60/40 |
| Ex. 14 | | | | 19.5 | 9.1 | | 70 | | | | 1.4 | | | | | | | 1/0.9 | 70 | 60/40 |
| Ex. 15 | | | | 17.2 | | 5.1 | 70 | | | | | 4.7 | 3 | | | | | 1/0.8 | 70 | 60/40 |
| Ex. 16 | 15.7 | | | | | 9.9 | 70 | | | | 1.4 | | 3 | | | | | 1/0.8 | 70 | 60/40 |
| Ex. 17 | | 26.5 | | | 12.4 | | 56.6 | | | | 1.6 | | | 2.9 | | | 3 | 1/0.9 | 56.6 | 60/40 |
| Ex. 18 | 15.7 | | | | | 9.9 | 70 | | | | 1.4 | | 3 | | | | 5 | 1/0.8 | 70 | 60/40 |
| C. Ex. 1 | | | | | | 65.8 | 30 | | | | 0.9 | | 3 | | | 0.3 | | — | 30 | 60/40 |
| C. Ex. 2 | | 65.8 | | | | | 30 | | | | 0.9 | | 3 | | | 0.3 | | — | 30 | 60/40 |
| C. Ex. 3 | | 28.1 | | | 16.8 | | | | | 54.8 | | | | | | 0.3 | | 1/0.3 | — | — |
| C. Ex. 4 | 20.1 | | | | 20.4 | | 56.5 | | | | | | | 3 | | | | 1/0.9 | 56.5 | 60/40 |
| C. Ex. 5 | 1.1 | | | | 0.9 | | 95 | | | | | | | 3 | | | | 1/15.8 | 95 | 60/40 |

(C.Ex. in the above table is intended to mean a comparative example.)

TABLE 2

| Components | Symbols | Contents |
|---|---|---|
| (A) Epoxy resin | A-1 | Tetraglycidyl diphenyl methane type epoxy resin (Trade name: Epikote 604 supplied by Yuka Shell Epoxy K.K.) |
| | A-2 | Dicyclo type epoxy resin (Trade name: HP-7200 supplied by Dainippon Ink & Chemicals, Inc. |
| | A-3 | Biphenyl type epoxy resin (Trade name: Epikote YX4000H supplied by Yuka Shell Epoxy K.K.) |
| | A-4 | Dicyclo type epoxy resin (Trade name: HP-7200H supplied by Dainippon Ink & Chemicals, Inc. |
| (B) Phenolic resin | B-1 | Novolak phenol resin (Trade name: Shonol CKM2400 supplied by Showa Highpolymer Co., Ltd.) |
| | B-2 | Novolak phenol resin (Trade name: Shonol BRG555 supplied by Showa Highpolymer Co., Ltd.) |
| (C) Epoxidized styrene-butadiene-styrene block copolymer | C-1 | Synthesis Example 1 |
| | C-2 | Synthesis Example 2 |
| | C-3 | Synthesis Example 3 |
| Styrene-butadiene-styrene block copolymer | | Styrene-butadiene-styrene block copolymer (Trade name: TR2000 supplied by Japan Synthetic Rubber Co., Ltd.) |
| (D) diaminosiloxane compound | D-1 | Diaminosiloxane (Trade name: TSL9306 supplied by Toshiba Silicone Co., Ltd.) |
| | D-2 | Diaminopolysiloxane (Trade name: TSL9886 supplied by Toshiba Silicone Co., Ltd.) |
| Silane coupling agent | E-1 | Epoxy-based silane coupling agent (Trade name: SilaAce S510 supplied by Chisso Corporation |
| | E-2 | Epoxy-based silane coupling agent (Trade name: SilaAce S530 supplied by Chisso Corporation) |
| | E-3 | Amino-based silane coupling agent (Trade name: SilaAce S310 supplied by Chisso Corporation |
| Curing accelerator | | Imidazole-based epoxy resin curing agent (Trade name: Curezole 2E4MZ supplied by Shikoku Chemicals Corp.) |
| Filler | | Anhydrous silica (Trade name: Aerosil R972 supplied by Nippon Aerosil Co., Ltd.) |

The adhesive compositions of the present invention and adhesive compositions of the comparative examples were then evaluated with respect to the following.

1. Compatibility

Liquid adhesive compositions of the above Examples 1 to 18 and of Comparative Examples 1 to 5 were each applied onto a release-treated polyethylene terephthalate film having a thickness of 38 μm so as to have a dry thickness of 30 μm, dried in a hot air circulating dryer at 130° C. for 5 minutes, laminated thereon with a release-treated polyethylene protective film having a thickness of 50 μm, and then subjected to ageing at 70° C./10 hours, so as to prepare an adhesive sheet.

Thereafter, the adhesive composition at the surface of each adhesive sheet was observed with a microscope for compatibility evaluation, and the results are shown in FIG. 3, in which ○ indicates a good compatibility and X a bad compatibility, represented, for example, by a marble-like appearance.

As is apparent from the evaluation results in FIG. 3, it has been confirmed that adhesive sheets using adhesive compositions of the present invention have good compatibility of components contained therein. On the other hand, the adhesive sheets of Comparative Examples 3 to 5 have a poor compatibility among components in the adhesive compositions, causing a problem in practical use.

2. Adhesion

Adhesion to Polyimide Film

Liquid adhesive compositions of the above Examples 1 to 18 and of Comparative Examples 1 to 5 were each applied onto a release-treated polyethylene terephthalate film having a thickness of 38 μm so as to have a dry thickness of 30 μm, dried in a hot air circulating dryer at 130° C. for 5 minutes, laminated thereon with a release-treated polyethylene protective film having a thickness of 50 μm, and then subjected to ageing at 70° C./10 hours, so as to prepare an adhesive sheet for determining adhesion.

Thereafter, while stripping off the polyethylene protective film, each adhesive sheet was thermo-compression bonded to a polyimide film having a thickness of 50 μm (trade name: Upilex 50S supplied by Ube Industries, Ltd.). Each adhesive sheet was then stripped of its polyethylene terephthalate film to have its adhesive layer thermo-compression bonded to a polyimide film having a thickness of 50 μm (trade name: Upilex 50S supplied by Ube Industries, Ltd.), followed by heating at 150° C. for 1 hour to cure the adhesive layer to prepare a sample for determining adhesion. The adhesion was measured by 90 degrees peeling-off with a Tensilon supplied by Shimadzu Corp.).

The same evaluation samples were also measured for their adhesions after a constant temperature and humidity test that was conducted with a constant temperature and humidity oven, under the following conditions: temperature: 121° C., humidity: 100% RH, and time period: 300 hours.

Adhesion to Copper Foil

Evaluation samples were prepared and determined for their adhesions to copper foil in the same manner as mentioned above, except that the polyimide film (trade name: Upilex 50S supplied by Ube Industries, Ltd.) used in the above was replaced by copper foil having a thickness of 18 μm (trade name: JTC-A supplied by Japan Energy Corp.).

Furthermore, the samples were also subjected to a constant temperature and humidity test under the same conditions as in the evaluation of adhesion to the polyimide film, and their adhesions thereafter were measured.

The evaluation results of adhesion of the adhesive layers to the polyimide film and the copper foil are shown in Table 3.

As is apparent from the evaluation results shown in Table 3, it has been confirmed that the adhesive compositions of the present invention have an adhesion of 0.7 kg/cm or more after the constant temperature and humidity test, while the adhesive compositions of the Comparative Examples are easily stripped from both the polyimide film and the copper foil, thus causing problems in practical use.

3. Endurance to reflow

Liquid adhesive compositions of the above Examples 1 to 18 and of Comparative Examples 1 to 5 were each applied onto a release-treated polyethylene terephthalate film having a thickness of 38 μm so as to have a dry thickness of 30 μm, dried in a hot air circulating dryer at 130° C. for 5 minutes to prepare an adhesive sheet, and then laminated thereon with a release-treated polyethylene protective film having a thickness of 50 μm.

Thereafter, while stripping off the polyethylene protective film, each adhesive sheet was thermo-compression bonded to a glass epoxy board of 200 μm thickness and 2.5 cm×2.5 cm size having an etched copper portion (trade name: CCL-EL170 supplied by Mitubishi Gas Chemical Co., Inc.).

Each adhesive sheet was then stripped of its polyethylene terephthalate film to have a glass chip of 0.9 cm×0.7 cm thermo-compression bonded thereto at 140° C. for 3 minutes under a pressure of 0.1 MPa, followed by heating at 90° C. for 1 hour and further at 150° C. for 2 hours to cure the adhesive layer. Endurance to reflow evaluation samples were thus prepared.

These evaluation samples were placed in a constant temperature and humidity oven for 48 hours under the conditions of 85° C. and 85% RH, passed through an IR reflow furnace that was set at 260° C., and then observed whether peeling and foaming were present. The results are shown in Table 3.

Five evaluation samples were prepared in each Example and Comparative Example, and the number of evaluation samples free of peeling and foaming is shown in Table 3. As is apparent from the evaluation results in Table 3, the adhesive compositions of the present invention did not cause peeling nor foaming, whereas those of the Comparative Examples caused peeling or foaming.

4. Thermal Cycle Test

Liquid adhesive compositions of the above Examples 1 to 18 and of Comparative Examples 1 to 5 were each applied onto a release-treated polyethylene terephthalate film having a thickness of 38 μm so as to have a dry thickness of 50 μm, dried in a hot air circulating dryer at 130° C. for 5 minutes to prepare an adhesive sheet, and were then laminated thereon with a release-treated polyethylene protective film having a thickness of 50 μm.

Thereafter, while stripping off the polyethylene protective film, each adhesive sheet was thermo-compression bonded to a glass epoxy board of 200 μm thickness and 2.5 cm×2.5 cm size having an etched copper portion (trade name: CCL-EL170 supplied by Mitubishi Gas Chemical Co., Inc.).

Each adhesive sheet was then stripped of its polyethylene terephthalate film to have a glass chip of 0.9 cm×0.7 cm thermo-compression bonded to the adhesive layer at 140° C. for 3 minutes under a pressure of 0.1 MPa, followed by heating at 90° C. for 1 hour and further at 150° C. for 2 hours to cure the adhesive layer. Evaluation samples for thermal cycle test were thus prepared.

These evaluation samples were subjected to a temperature cycling test of −65° C. to +150° C. In this case, however, the test was conducted under the conditions of 500 cycles, with one cycle having a temperature history over 30 minutes with a high temperature of 150° C. and a low temperature of −65° C.

After completion of the temperature cycling test, observations were made for peeling and foaming. The results are shown in Table 3.

Five evaluation samples were prepared in each Example and Comparative Example, and the number of evaluation samples free of peeling and foaming is shown in Table 3. As is apparent from the evaluation results in Table 3, the adhesive compositions of the present invention did not cause peeling nor foaming, whereas those of the Comparative Examples caused peeling or foaming.

5. Water Absorption

Liquid adhesive compositions of the above Examples 1 to 18 and of Comparative Examples 1 to 5 were each applied onto a release-treated polyethylene terephthalate film having a thickness of 38 μm so as to have a dry thickness of 60 μm, dried in a hot air circulating dryer at 130° C. for 5 minutes to prepare an adhesive sheet, and then laminated thereon with a release-treated polyethylene protective film having a thickness of 50 μm.

Thereafter, each adhesive sheet was stripped of its polyethylene protective film and polyethylene terephthalate film in this order, and heating was effected at 150° C. for 1 hour to cure the adhesive layer to prepare evaluation samples of 5 cm×5 cm for water absorption. The water absorption test was conducted under the following conditions, using a constant temperature and humidity oven: temperature: 121° C., humidity: 100% RH, and time period: 24 hours.

Thereafter, water absorptions were calculated using the following formula, and the results are shown in Table 3.

$$\text{Water absorption} = \left( \frac{\text{Sample weight after water absorption} - \text{Sample weight before water absorption}}{\text{Sample weight befor water absorption}} \right) \times 100(\%)$$

As is apparent from the evaluation results in Table 3, it has been confirmed that, with the adhesive compositions of the present invention, the water absorptions were less than 0.7%, while with those of the Comparative Examples, the water absorptions exceeded 1.0%, thus causing a problem in practical use.

6. Elongation

Liquid adhesive compositions of the above Examples 1 to 18 and of Comparative Examples 1 to 5 were each applied onto a release-treated polyethylene terephthalate film having a thickness of 38 μm so as to have a dry thickness of 60 μm, dried in a hot air circulating dryer at 130° C. for 5 minutes to prepare an adhesive sheet, and then laminated thereon with a release-treated polyethylene protective film having a thickness of 50 μm.

Thereafter, each adhesive sheet was stripped of its polyethylene protective film and polyethylene terephthalate film in this order, and heating was effected at 150° C. for 1 hour to cure the adhesive layer to prepare samples of 1 cm×12 cm for evaluating elongations. Measurement was made using a Tensilon supplied by Shimadzu Corp., and the elongations were calculated from the following formula. The results are shown in Table 3.

$$\text{Elongation} = \left( \frac{\text{Sample length after extension} - \text{Sample length before extension}}{\text{Sample length before extension}} \right) \times 100(\%)$$

As is apparent from the evaluation results in Table 3, with the adhesive compositions of the present invention, the elongations exceeded 130%, while with those of the Comparative Examples 1, 2 and 4, the elongations were low, being less than 120%.

7. Foaming and Embedding

Liquid adhesive compositions of the above Examples 1 to 18 and of Comparative Examples 1 to 5 were each applied onto a release-treated polyethylene terephthalate film having a thickness of 38 μm so as to have a dry thickness of 30 μm, dried in a hot air circulating dryer at 130° C. for 5 minutes, laminated thereon with a release-treated polyethylene protective film having a thickness of 50 μm, and then subjected to ageing at 70° C./10 hours, so as to prepare adhesive sheets.

On the other hand, a photo resist coating was thermo-compression bonded to a flexible board (trade name: Espanex supplied by Nippon Steel Chemical Co., Ltd.), followed by etching and stripping off the resist coating to prepare a ladder-type circuit having a conductor/conductor spacing of 50 μm/50 μm. The above adhesive sheets, while stripping off their polyethylene protective films, were each thermo-compression bonded to one of the thus prepared circuits. The polyethylene terephthalate film was then stripped off, followed by heating at 150° C. for 1 hour to cure the adhesive layer. Evaluation samples for foaming and embedding properties were thus prepared.

Thereafter, evaluation was made of the foaming state (judged by whether foaming is present between the ladder-type circuit and the adhesive layer) and the embedded state (judged by whether an open space is present which is caused by incomplete bonding around the ladder-type circuit) with a microscope. The results are shown in Table 3, in which ○ indicates those which were free of the problem of foaming or embedding and X indicates those which are accompanied with the problem of foaming or embedding.

8. Electrical Reliability

Liquid adhesive compositions of the above Examples 1 to 18 and of Comparative Examples 1 to 5 were each applied onto a release-treated polyethylene terephthalate film having a thickness of 38 μm so as to have a dry thickness of 30 μm, dried in a hot air circulating dryer at 130° C. for 5 minutes, laminated thereon with a release-treated polyethylene protective film having a thickness of 50 μm, and then subjected to ageing at 70° C./10 hours, so as to prepare adhesive sheets.

On the other hand, a photo resist coating was thermo-compression bonded to a flexible board (trade name: Espanex supplied by Nippon Steel Chemical Co., Ltd.), followed by etching and stripping off the resist coating to prepare a comb-type circuit having a conductor/conductor spacing of 50 μm/50 μm. The above adhesive sheets, while stripping off their polyethylene protective films, were each thermo-compression bonded to one of the thus prepared circuits. The polyethylene terephthalate film was then stripped off, followed by heating at 150° C. for 1 hour to cure the adhesive layer. Evaluation samples for electrical reliability were thus prepared.

These evaluation samples were each placed for 300 hours in a constant temperature and humidity oven adjusted to a temperature of 130° C. and a humidity of 85% RH while applying a direct current of 5V to the comb-type circuit. Thereafter, the state of the comb-type circuit was evaluated. The results are shown in Table 3, in which X indicates those which suffered from migration at the comb-type circuit (copper foil portion) and ○ those which were free of migration. As is apparent from the evaluation results in Table 3, with the adhesive compositions of the present invention, no migration was observed.

TABLE 3

| | Compat-ibility | Adhesion to polyimide film (kg/cm) | | Adhesion to copper foil film (kg/cm) | | Endur-ance to reflow | Thermal cycle test | Water absorp-tion (%) | Elonga-tion (%) | Foaming | Embed-ding | Electri-cal relia-bility |
| | | Before C.T. and H. test | After C.T. and H. test | Before C.T. and H. test | After C.T. and H. test | | | | | | | |
|---|---|---|---|---|---|---|---|---|---|---|---|---|
| Ex. 1 | ○ | 2.7 | 0.7 | 1.8 | 2.7 | 5/5 | 5/5 | 0.5 | 150 | ○ | ○ | ○ |
| Ex. 2 | ○ | 2.3 | 0.7 | 2.4 | 1.4 | 5/5 | 5/5 | 0.5 | 140 | ○ | ○ | ○ |
| Ex. 3 | ○ | 3.3 | 1.4 | 1.8 | 1.7 | 5/5 | 5/5 | 0.5 | 210 | ○ | ○ | ○ |
| Ex. 4 | ○ | 2.3 | 1.2 | 1.8 | 1 | 5/5 | 5/5 | 0.5 | 180 | ○ | ○ | ○ |
| Ex. 5 | ○ | 3 | 1.3 | 1.8 | 1.7 | 5/5 | 5/5 | 0.5 | 220 | ○ | ○ | ○ |
| Ex. 6 | ○ | 2 | 0.7 | 1.6 | 1 | 5/5 | 5/5 | 0.5 | 160 | ○ | ○ | ○ |
| Ex. 7 | ○ | 1.8 | 0.7 | 1.3 | 1 | 5/5 | 5/5 | 0.7 | 140 | ○ | ○ | ○ |
| Ex. 8 | ○ | 2 | 1 | 1.8 | 1.4 | 5/5 | 5/5 | 0.7 | 180 | ○ | ○ | ○ |
| Ex. 9 | ○ | 2 | 0.8 | 1.4 | 0.8 | 5/5 | 5/5 | 0.5 | 140 | ○ | ○ | ○ |
| Ex. 10 | ○ | 3.3 | 1.3 | 1.6 | 1.2 | 5/5 | 5/5 | 0.5 | 210 | ○ | ○ | ○ |
| Ex. 11 | ○ | 1.8 | 0.8 | 1.4 | 1 | 5/5 | 5/5 | 0.5 | 180 | ○ | ○ | ○ |
| Ex. 12 | ○ | 3 | 1.3 | 1.8 | 1 | 5/5 | 5/5 | 0.5 | 160 | ○ | ○ | ○ |
| Ex. 13 | ○ | 1.4 | 0.8 | 1.4 | 0.8 | 5/5 | 5/5 | 0.5 | 140 | ○ | ○ | ○ |
| Ex. 14 | ○ | 2.7 | 1.3 | 1.8 | 1.3 | 5/5 | 5/5 | 0.7 | 260 | ○ | ○ | ○ |
| Ex. 15 | ○ | 1.8 | 1.1 | 1.2 | 1.1 | 5/5 | 5/5 | 0.5 | 180 | ○ | ○ | ○ |
| Ex. 16 | ○ | 1.6 | 1 | 1.2 | 0.8 | 5/5 | 5/5 | 0.5 | 140 | ○ | ○ | ○ |
| Ex. 17 | ○ | 2 | 1.1 | 1.6 | 1.4 | 5/5 | 5/5 | 0.6 | 200 | ○ | ○ | ○ |
| Ex. 18 | ○ | 1.3 | 1 | 1.1 | 0.8 | 5/5 | 5/5 | 0.6 | 130 | ○ | ○ | ○ |
| C. Ex. 1 | ○ | 0.8 | 0 | 0.6 | 0 | 0/5 | 0/5 | 0.5 | 80 | ○ | ○ | x |
| C. Ex. 2 | ○ | 0.8 | 0 | 0.8 | 0 | 0/5 | 0/5 | 1.0 | 100 | ○ | ○ | x |
| C. Ex. 3 | x | 0.6 | 0 | 0.8 | 0 | 2/5 | 0/5 | 1.2 | 150 | x | x | x |
| C. Ex. 4 | x | 0.9 | 0 | 0.8 | 0 | 0/5 | 2/5 | 1.0 | 120 | x | ○ | ○ |
| C. Ex. 5 | x | 1.0 | 0 | 1.0 | 0 | 0/5 | 2/5 | 1.3 | 200 | x | x | x |

(In the table above, Ex. is intended to mean an Example and C. Ex. a Comparative Example, and C.T. and H. test is intended to mean a constant temperature and humidity test.)

As described hereinabove, an adhesive composition for semiconductor devices according to the present invention has an excellent adhesion and makes it possible to industrially provide adhesive sheets for semiconductor devices which are excellent in endurance to reflow, thermal cycle test, processability and electrical reliability. Furthermore, with an adhesive composition for semiconductor devices according to the present invention, an improvement may be made in the reliability of surface-mounting type semiconductor devices.

What is claimed is:

1. An adhesive composition for semiconductor devices, comprising (A) epoxy resin, (B) phenolic resin, (C) epoxidized styrene-butadiene-styrene block copolymer and (D) diaminosiloxane compound.

2. An adhesive composition for semiconductor devices according to claim 1, wherein a ratio of said (A) epoxy resin to said (B) phenolic resin is 1:0.6 to 1:1.4 in terms of an equivalent ratio of functional groups.

3. An adhesive composition for semiconductor devices according to claim 1, wherein a ratio of said (C) epoxidized styrene-butadiene-styrene block copolymer is 30 to 80% by weight of a total solid content of said adhesive composition.

4. An adhesive composition for semiconductor devices according to claim 1, wherein a weight ratio of butadiene to styrene in said (C) epoxidized styrene-butadiene-styrene block copolymer is 1/99 to 70/30.

5. An adhesive composition for semiconductor devices according to claim 1, wherein an epoxy equivalent of said (C) epoxidized styrene-butadiene-styrene block copolymer is 140 to 6000.

6. An adhesive composition for semiconductor devices according to claim 1, wherein said (D) diaminosiloxane compound is a diaminosiloxane compound having an amino group at both ends represented by a general formula (1):

wherein $R^1$ is an alkylene group having 1 to 10 carbon atoms and n is an integer of 0 to 10.

7. An adhesive composition for semiconductor devices according to claim 1, wherein said (D) diaminosiloxane compound is 0.3 to 10% by weight of a total solid content of said adhesive composition.

8. An adhesive sheet for semiconductor devices, comprising a support and an adhesive composition as recited in claim 1, laminated on at least one surface of said support.

9. An adhesive sheet for semiconductor devices according to claim 8, wherein said support comprises an insulating film or releasable film.

* * * * *